US005706077A

United States Patent [19]
Unno

[11] Patent Number: 5,706,077
[45] Date of Patent: Jan. 6, 1998

[54] SCAN TYPE PROJECTION EXPOSURE APPARATUS AND MICRODEVICE MANUFACTURING METHOD USING THE SAME

[75] Inventor: Yasuyuki Unno, Minamikawachimachi, Japan

[73] Assignee: Canon Kabushiki Kaisha, Tokyo, Japan

[21] Appl. No.: 423,110

[22] Filed: Apr. 18, 1995

[30] Foreign Application Priority Data

Apr. 22, 1994 [JP] Japan .................. 6-107867

[51] Int. Cl.$^6$ .................. H01L 21/30; G03B 27/72
[52] U.S. Cl. .................. 355/71; 355/67; 359/227
[58] Field of Search .................. 355/71, 67, 53; 359/227, 232, 233

[56] References Cited

U.S. PATENT DOCUMENTS

| 4,688,932 | 8/1987 | Suzuki | 355/51 |
|---|---|---|---|
| 5,184,176 | 2/1993 | Unno et al. | 355/52 |
| 5,194,893 | 3/1993 | Nishi | 355/53 |
| 5,459,000 | 10/1995 | Unno | 430/5 |

FOREIGN PATENT DOCUMENTS 4-277612  10/1992  Japan .

OTHER PUBLICATIONS

Patent Abstracts of Japan, Kokai No. JP 2-220425, vol. 14, No. 524, Nov. 16, 1990.

*Primary Examiner*—Arthur T. Grimley
*Assistant Examiner*—Herbert Kerner
*Attorney, Agent, or Firm*—Fitzpatrick, Cella, Harper & Scinto

[57] ABSTRACT

A scanning projection exposure apparatus includes an imaging system for imaging a pattern of an original, placed on an object plane, upon a substrate, and a scanning device for relatively scanning the original and the substrate relative to the imaging system, wherein the imaging system provides different imaging positions with respect to a direction of an optical axis, to plural zones on the object plane, which zones are juxtaposedly defined along a direction of scan.

12 Claims, 10 Drawing Sheets

SCAN TYPE PROJECTION EXPOSURE APPARATUS AND MICRODEVICE MANUFACTURING METHOD USING THE SAME

FIELD OF THE INVENTION AND RELATED ART

This invention relates to a scan type projection exposure apparatus and a microdevice manufacturing method suitably usable, for example, in a lithographic process of the processes for manufacturing devices such as semiconductor devices (e.g., ICs or LSIs), image pickup devices (e.g., CCDs), display devices (e.g., liquid crystal panels) or magnetic heads, for example.

With increasing density of a semiconductor device such as an IC or an LSI, fine processing techniques for a semiconductor wafer have advanced considerably. In these fine processing techniques, there are many types of reduction projection exposure apparatuses (steppers) proposed, in which an image of a circuit pattern of a mask (reticle) is formed on a photosensitive substrate through a projection exposure apparatus while the substrate is exposed in the step-and-repeat method.

In this stepper, the pattern transfer process is performed by projecting, in a reduced scale, a circuit pattern of a reticle upon a certain position (shot) on a wafer surface through a projection optical system having a predetermined reduction magnification. After this pattern projection and transfer operation are completed, a stage on which the wafer is placed is moved by a predetermined amount and then the pattern transfer operation is repeated to print the pattern on another position on the wafer. This operation is repeated, and exposures of the whole wafer surface are performed.

On the other hand, in order to meet enlargement of a chip area of an LSI, recently many proposals have been made in regard to a projection exposure apparatus of the type called a "step-and-scan type exposure apparatus" by which high resolution is attainable and by which the picture field size can be enlarged.

In such step-and-scan type projection exposure apparatus, a slit-like exposure region is defined, and exposure of one shot on the wafer is performed by scanningly moving a reticle and a wafer relative to a projection optical system and to exposure light. After the scanning exposure of one shot is completed, a stage on which the wafer is placed is moved by a predetermined amount and then the scanning exposure of the subsequent shot of the wafer is performed. This operation is repeated, and exposures of the whole wafer surface are performed.

Figure 1:
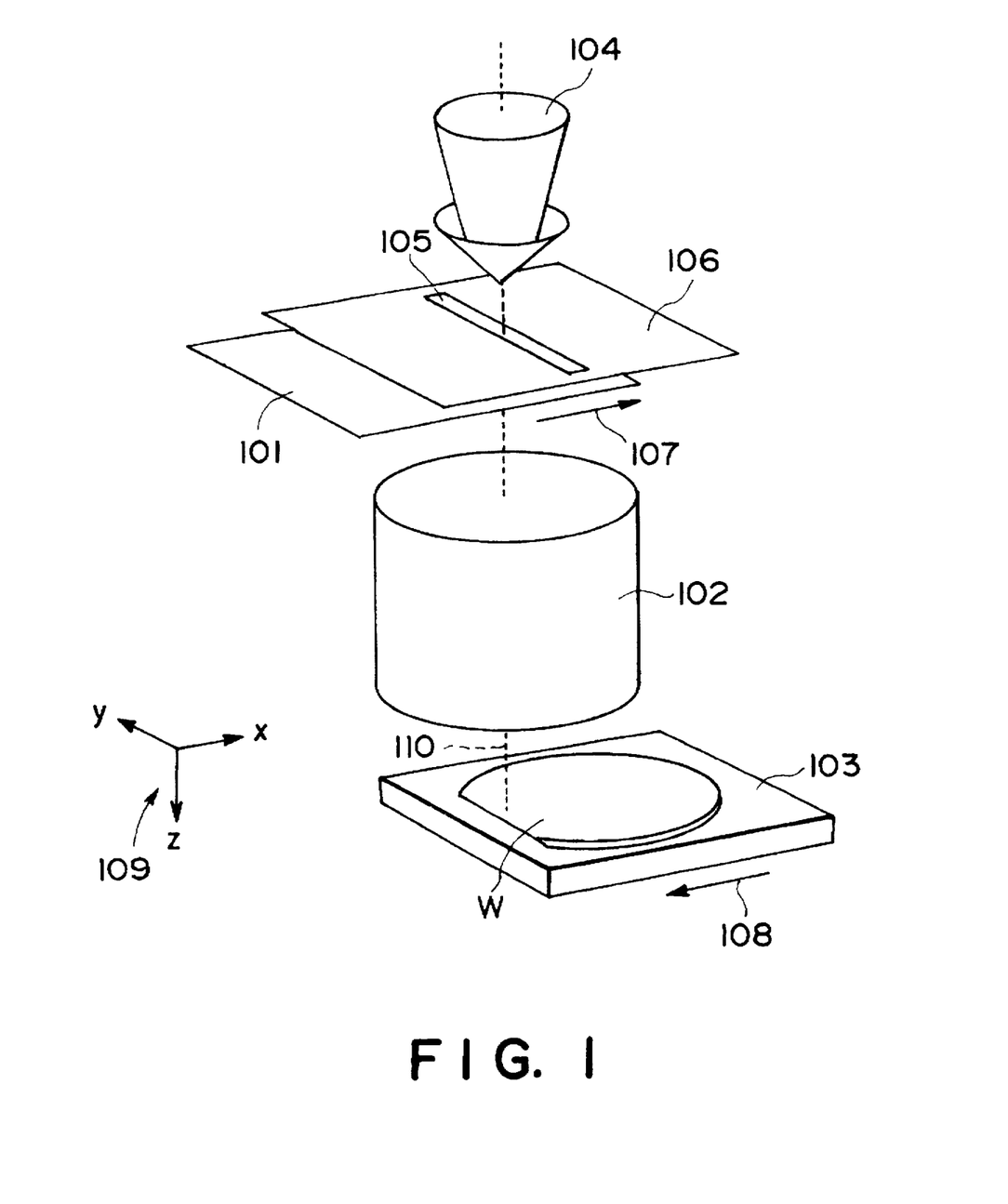
FIG. 1 is a schematic view of a step-and-scan type exposure apparatus of a known type.

FIG. 1 is a schematic perspective view of a main portion of a known step-and-repeat type projection exposure apparatus.

Denoted in the drawing at 101 is a reticle on which a circuit pattern is formed. Denoted at 102 is a projection lens, and denoted at 103 is a movable stage on which a wafer W is placed. Denoted at 106 is an aperture member having a slit opening 105 and being disposed above and close to the reticle 101. Denoted at 104 is illumination light.

For projection and transfer of the circuit pattern of the reticle 101, illuminated with the illumination light 104, onto the wafer W placed on the stage 103 by use of the projection lens 102, the aperture member 106 having the slit opening 105 serves to define slit-like illumination light with which the reticle 101 is illuminated. Thus, only that portion of the circuit pattern of the reticle 101 on which the slit-like illumination light impinges, is projected and transferred onto the wafer W surface.

Then, as illustrated in FIG. 1, the reticle 101 is scanningly moved in the direction depicted by an arrow 107 at a predetermined speed and, simultaneously therewith, the stage 103 is scanningly moved in the direction depicted by an arrow 108 at a speed corresponding to the product of the scanning speed of the reticle 101 and the imaging magnification of the projection lens 102. By this, the whole circuit pattern of the reticle 101 is projected and transferred to one shot of the wafer W.

In the exposure apparatus shown in FIG. 1, when the coordinates are set as depicted at 109, the optical axis 110 of the projection lens 102 extends along the Z-axis direction, the lengthwise direction of the slit opening 105 lies in the Y-axis direction, and the scanning direction of the reticle 101 and the stage 103 lies in the X-axis direction. After the whole circuit pattern of the reticle 101 is transferred onto one shot of the wafer, the stage 103 is moved by a predetermined amount (i.e., it is moved stepwise), and the pattern transfer operation is repeated so as to print the circuit pattern of the reticle 101 on another shot of the wafer W in the manner described above.

Figure 2A:
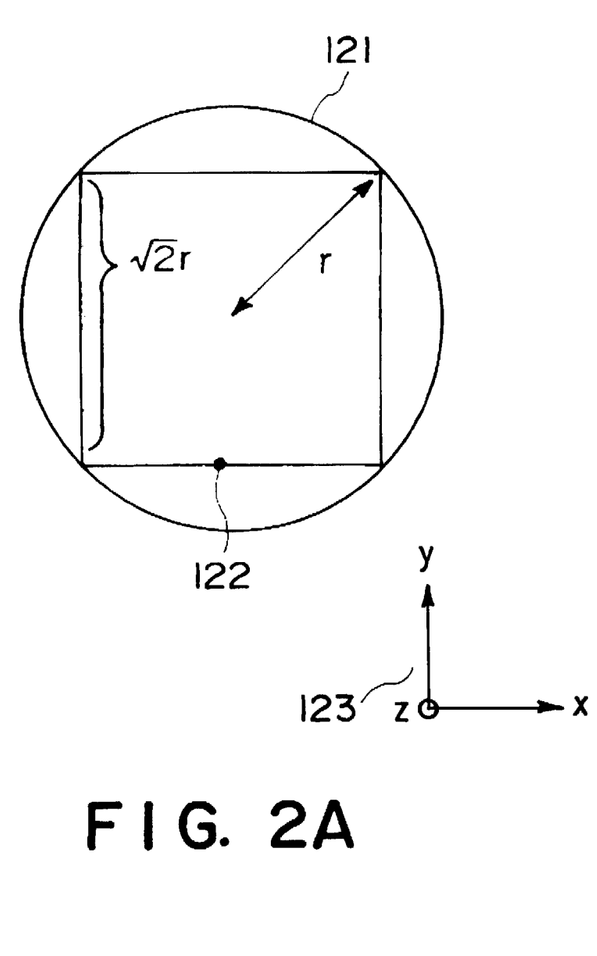
FIGS. 2A and 2B are schematic views for explaining a difference between an exposure region defined by a stepper and an exposure region defined by a step-and-scan type exposure apparatus.

Here, referring to FIGS. 2A and 2B, the reason why the exposure region can be expanded by the step-and-scan projection exposure method as compared with that by the stepper (without scan) method, will be explained.

The exposure region is limited within a range in which aberrations of the projection lens are corrected satisfactorily. It is now assumed that the circle 121 (radius: r) of FIG. 2A depicts such a range in which the aberrations of the projection lens are corrected satisfactorily and that the circuit pattern is formed to be accommodated in a square. Then, the exposure region has a largest square inscribed in the circle 121, namely, a square having a length $2\sqrt{2}\times r$ at each side such as depicted by a line segment 122 in FIG. 2A. The area $2r^2$ of this square corresponds to the exposure region in an ordinary stepper. Here, the X and Y axes of the coordinates 123 are laid so that they correspond to the directions of two orthogonal sides of the square 122, as illustrated.

Figure 2B:
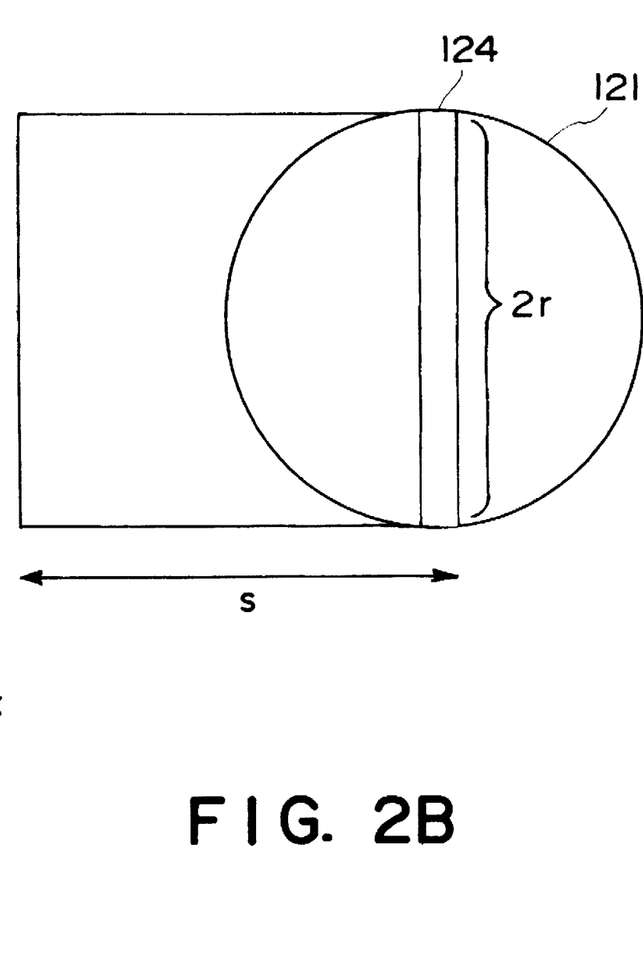

On the other hand, as illustrated in FIG. 2B, if the shape of the square inscribed in the circle 121 of an aberration corrected range is deformed into a rectangular shape, the length of the major side (along the Y axis) of the rectangle 124 comes close to 2r. Here, if the circuit pattern is scanned with this rectangle 124 along the X-axis direction so as to transfer the whole circuit pattern, on that occasion the exposure region is determined by an area 2rs (s is the length being able to be scanned) which is larger than the area $2r^2$. Thus, in the step-and-scan projection exposure method, the exposure region can be magnified in this manner.

Such a step-and-scan type projection exposure apparatus usually employs a projection lens having a large N.A. (numerical aperture) so as to provide high resolution. Here, if the exposure wavelength is denoted by λ, the depth of focus is determined by λ/N.A., and it becomes very small. In order to assure good exposure regardless of not a large surface unevenness, a depth of focus of a certain magnitude should be kept.

It is known that a multiple exposure method in which, while changing the relative position of a reticle and a wafer along the optical axis direction, a plurality of images are superposedly printed, is effective to apparently enlarge the depth of focus. Japanese Laid-Open Patent Application, Laid-Open No. 277612/1992 proposes a multiple exposure method in a step-and-scan exposure apparatus in which scanning exposure is performed while holding a wafer with inclination of a predetermined angle relative to a reticle.

The multiple exposure method proposed in the aforementioned patent application will be explained here with reference to FIGS. 3–6.

Figure 3:
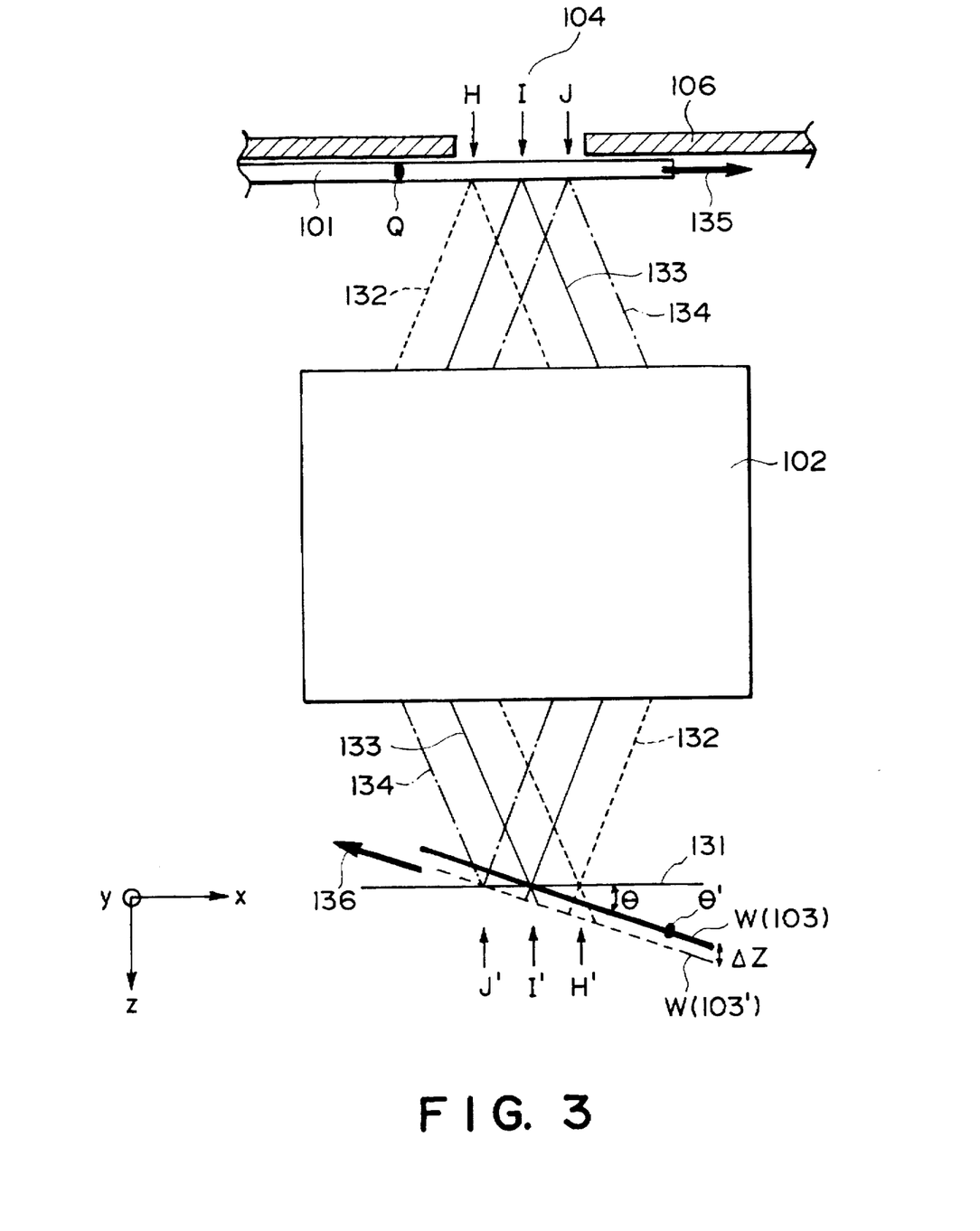
FIG. 3 is a schematic view for explaining the principle of a multiple exposure process.

FIG. 3 is a schematic view of the step-and-scan type exposure apparatus of FIG. 1, being illustrated two-dimensionally along the X-Z plane. In the drawing, it is important that a wafer W (103) is placed with inclination of a predetermined angle θ with respect to an image plane 131 of a projection lens 102. Reference characters H, I and J denote points on an object plane of the projection lens 102, respectively, and imaging lights 132, 133 and 134 emitted from these points are imaged at points H', I' and J' on the image plane 131. Here, at the point I', the surface of the wafer W coincides with the image plane 131. However, at the points H' and J', the wafer surface deviates from the image plane in the Z direction by certain amounts.

The multiple exposure is performed by tilting the wafer W and by scanningly moving it in the direction of an arrow 136. In order to explain this, now the process of imaging about one point Q on the reticle 101 will be explained. It is assumed that a point Q' is the point on the wafer W where the image of the point Q is to be transferred to.

Figure 4A:
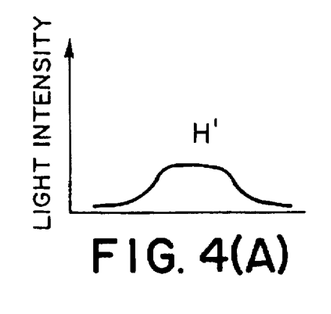
FIGS. 4(A) through 4(C) are schematic views for explaining a light intensity distribution to be produced by the multiple exposure process.
Figure 4B:
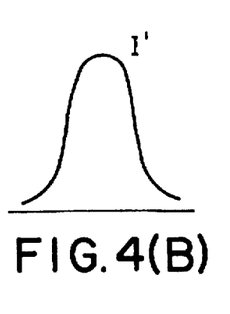

At the moment when, in the scanning movement of the reticle 101 in the direction of an arrow 135, the point Q just comes to the position of the point H, the point Q' is at the position of the point H', and the image is transferred to there. At this moment, since the point Q' is not just on the image plane 131, the light intensity distribution at the point Q' has a low contrast as depicted in FIG. 4(A). As the point Q displaces to the position of the point I, the point Q' also moves to the position of the point I'. However, at this position I', the surface of the wafer W coincides with the image plane 131 and, therefore, the light intensity distribution defined at the point Q' is sharp such as illustrated in FIG. 4(B).

Figure 4C:
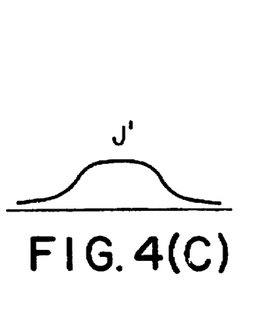

Subsequently, as the point Q' displaces to the position of the point J, the point Q' also moves to the position of the point J'. The light intensity distribution there is such as illustrated in FIG. 4(C). Actually, during the period in which the point Q is irradiated with illumination light, the light intensity distribution at the point Q' changes uninterruptedly. However, for simplicity of explanation, illustration is made with regard to only three representative points H, J and I in the drawing.

Figure 5:
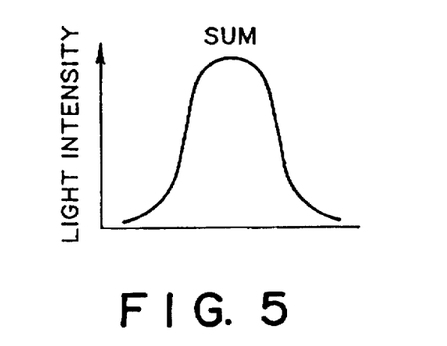
FIG. 5 is a schematic view for explaining an overall light intensity distribution to be produced by the multiple exposure process.

The pattern transfer process is based on accumulation of light intensity. Thus, at the point Q', an image is formed by a light intensity distribution as shown in FIG. 5 which results from superposition of the light intensity distributions having been provided at the points H', I' and J'.

Figure 6A:
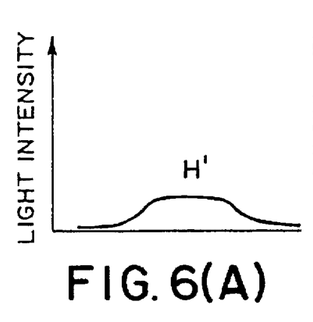
FIGS. 6(A) through 6(C) are schematic views for explaining another example of a light intensity distribution to be produced by the multiple exposure process.
Figure 6B:
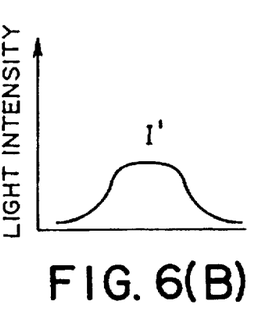
Figure 6C:
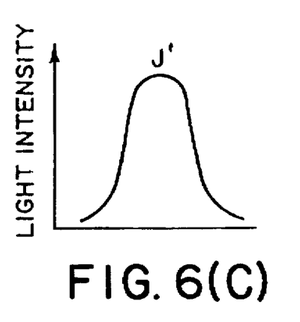

Advantages of the multiple exposure method may be explained as follows. If the wafer W is deviated from the position, denoted at 103, along the Z-axis direction by an amount Δz, the light intensity distributions provided at the positions of the points H', I' and J' as a result of scanning movement will be such as illustrated in FIG. 6(A), 6(B) and 6(C). As compared with those of FIG. 4, the shape of the distribution at each of the positions H' and I' is deteriorated. However, at the position J', since the wafer surface coincides with the image plane 131 there, a best distribution shape is produced. The overall intensity will be similar to that illustrated in FIG. 5. Even if the wafer deviation is in the opposite direction, also a light intensity similar to that of FIG. 5 will be produced. Thus, as a consequence, a good light intensity distribution is obtainable within a range of 2Δz. This range is wider than that obtainable without multiple exposure and, therefore, the depth of focus is substantively enlarged.

However, such a multiple exposure method requires a complicated scanning exposure process wherein a stage has to be scanningly moved while being held inclined, not horizontally.

SUMMARY OF THE INVENTION

It is an object of the present invention to provide an improved scan type projection exposure apparatus.

It is another object of the present invention to provide a scan type projection exposure apparatus by which a multiple exposure process can be performed in a simple manner.

It is a further object of the present invention to provide an improved device manufacturing method by which a multiple exposure process can be performed in a simple manner.

In accordance with an aspect of the present invention, there is provided a scanning projection exposure apparatus, comprising: imaging means for imaging a pattern of an original, placed on an object plane, upon a substrate; and scanning means for relatively scanning the original and the substrate relative to said imaging means; wherein said imaging means provides different imaging positions with respect to a direction of an optical axis, to plural zones on the object plane, which zones are juxtaposedly defined along a direction of scan.

In accordance with another aspect of the present invention, there is provided a device manufacturing method which comprises a step of printing a device pattern on a substrate by use of such a scanning projection exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 12(A) and 10(B) are schematic views for explaining a light intensity distribution upon an image plane in the projection exposure apparatus of FIG. 7.

DESCRIPTION OF THE PREFERRED EMBODIMENTS

Figure 7:
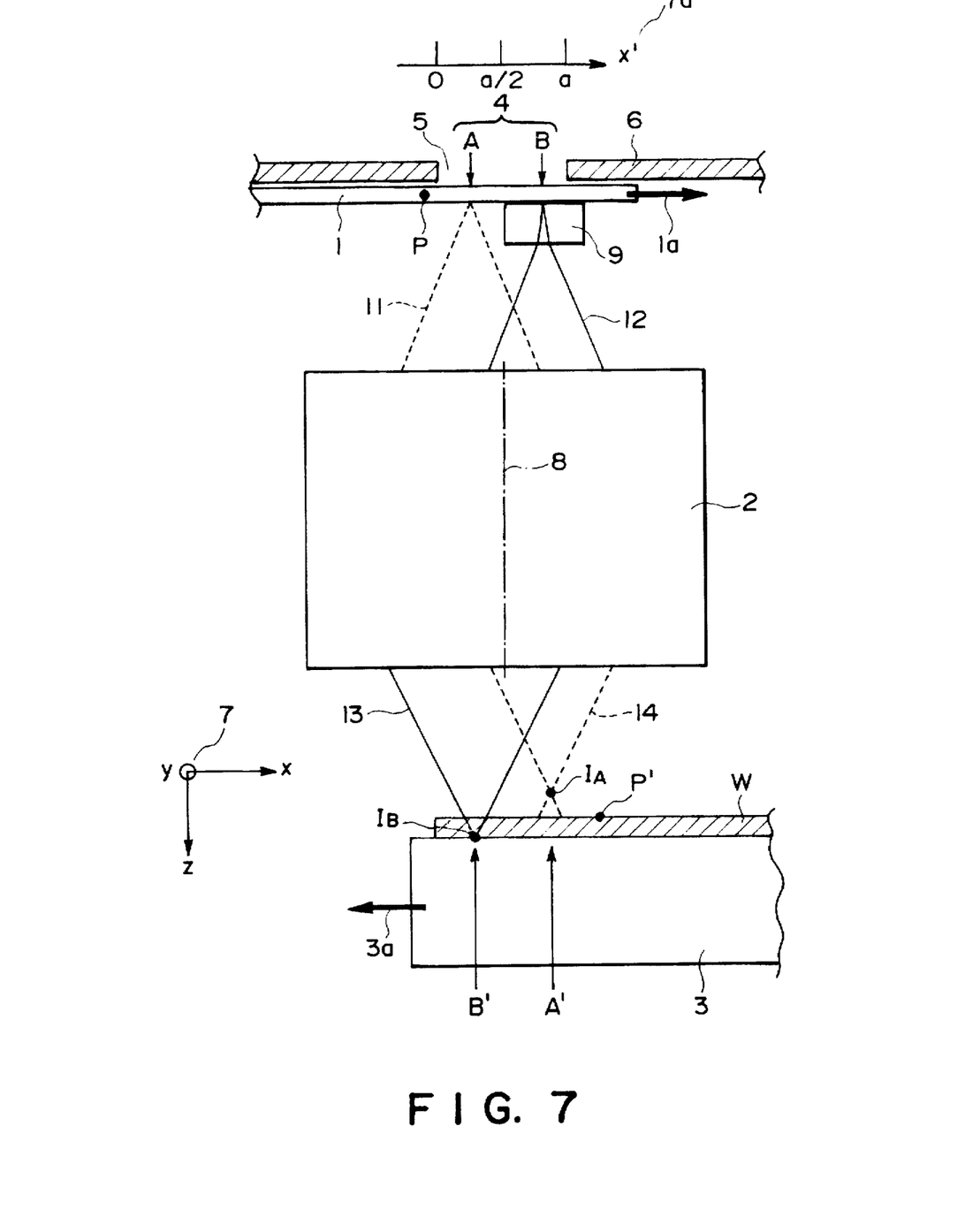
FIG. 7 is a schematic view of a main portion of a projection exposure apparatus according to a first embodiment of the present invention.

FIG. 7 is a schematic view of a main portion of a first embodiment of the present invention, wherein the invention is applied to a projection exposure apparatus for performing a multiple exposure process in a step-and-scan manner.

Denoted in the drawing at 1 is a reticle or mask (first object) on which a circuit pattern is formed. Denoted at 2 is a projection lens (projection optical system), and denoted at 3 is a movable stage on which a wafer W (second object) is placed. Denoted at 4 is illumination light supplied from an illumination system (not shown). The reticle 1 is placed on a movable stage.(not shown), and the reticle can be scanningly moved by this stage.

Denoted at 6 is an aperture member having a slit opening 5 formed in a portion thereof. The aperture member 6 is disposed above and close to the reticle 1. In place of disposing this aperture member 6 (slit opening 5) just before the reticle, it may be disposed at a position, within an illumination optical system, which position is optically conjugate with the reticle 1. Coordinates of X, Y and Z axes are such as depicted at 7.

Denoted at 11–14 are light rays, and what is illustrated schematically is the manner that diffraction lights from the circuit pattern of the reticle 1 come to the wafer W placed on the stage 3.

In this embodiment, the circuit pattern is illuminated with slit-like light of the illumination light 4, and the circuit pattern is projected by the projection lens 2 onto the wafer W. In this embodiment, the optical axis 8 of the projection optical system 2 extends along the Z-axis direction, and the lengthwise direction of the slit opening 5 lies along the Y-axis direction. The minor direction (widthwise direction) of the slit opening 5 as well as the scan directions 1a and 3a of the reticle 1 and the wafer W, respectively, are laid along the X-axis direction.

With respect to the X-axis direction of the slit opening 5, an X' coordinate axis is defined such as denoted at 7a in the drawing, so that the coordinates at the opposite ends of the slit opening 5 are represented as X'=0 and X'=a, respectively.

The reticle 1 and the stage 3 are both placed parallel to the X-Y plane. In a similar manner as has been described with reference to FIG. 2, the reticle 1 is scanningly moved in the X-axis direction as depicted by an arrow 1a and, simultaneously, the stage 3 is scanningly moved in a timed relation therewith also in the X-axis direction as depicted by an arrow 3a, at a speed corresponding to the product of the scan speed of the reticle 1 and the projection magnification of the projection lens 2. By this, the whole circuit pattern of the reticle 1 is projected and transferred to the wafer W placed on the stage 3. The wafer is subsequently processed (e.g., in a developing process), and semiconductor devices are manufactured.

Denoted at 9 is an optical member which comprises, in this embodiment, a dielectric material member of a rectangular solid shape having an even thickness with respect to the X-axis direction. This dielectric material member 9 serves to change the optical path length for diffraction light flux from the circuit pattern to thereby change the imaging position with respect to the Z-axis direction.

As an important feature of the projection exposure apparatus of this embodiment, the dielectric material member 9 is disposed just after the reticle 1. The dielectric material member elongates along the slit opening 5, in the Y-axis direction, beyond the length of the slit opening 5. In the X-axis direction, it has a width of a half of the slit opening 5, that is, it covers the range from X'=a/2 to X'=a.

Figure 8:
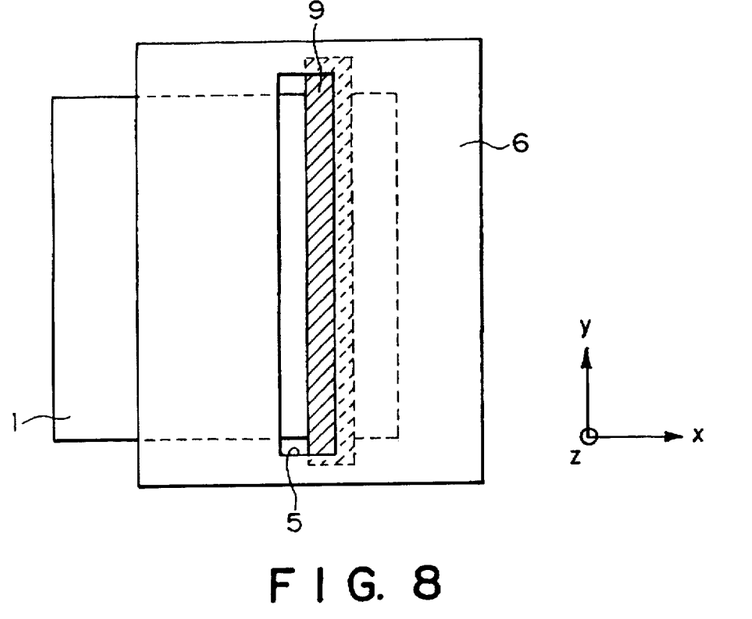
FIG. 8 is a plan view of a portion of the projection exposure apparatus of FIG. 7.

FIG. 8 illustrates the positional relationship of the reticle 1, the aperture member 6, the slit opening 5 and the dielectric material member 9, along the X-Y plane. Reference characters A and B in FIG. 7 denote the points which are on he object plane of the projection lens 2, respectively. Light emitted from the point A is imaged by the projection lens 2 upon a point $I_A$ having the same X-axis coordinate of the point A'. On the other hand, light emitted from the point B goes through the dielectric material member 9 and is imaged on a point $I_B$ having the same X-axis coordinate of the point B'. As seen from the drawing, the point $I_A$ and the point $I_B$ have different Z coordinates.

Figure 9A:
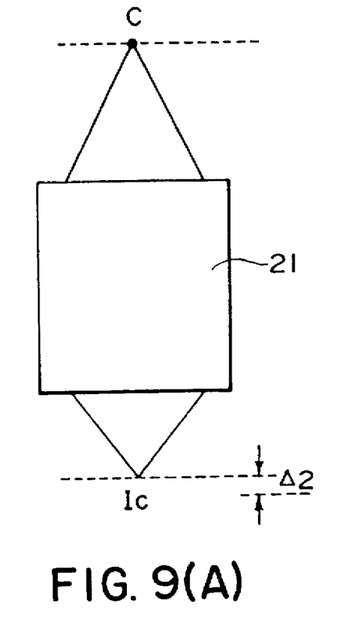
FIGS. 9(A) and 9(B) are schematic views for explaining a portion of the projection exposure apparatus of FIG. 7.
Figure 9B:
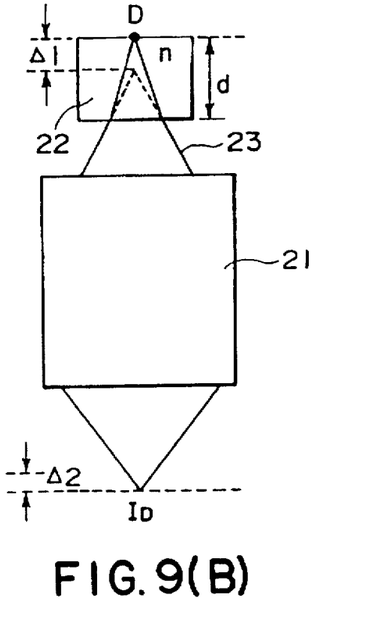

FIGS. 9(A) and 9(B) schematically illustrate how the imaging position changes with insertion of a dielectric material member 22 just after an object point D. Denoted in these figures at 21 is a projection lens, and denoted at 22 (FIG. 9(B) is a dielectric material member having a thickness d in the optical axis direction and having a refractive index n (n>1). In FIG. 9(A), an object point C is imaged by the projection lens 21 upon an image point $I_C$.

As illustrated in FIG. 9(B), if the dielectric material member 22 is inserted into the optical path, an object point D is imaged upon an image point $I_D$. Due to the effect of refraction, light from the object point D is deflected as light 23, such that it can be said that the image point is substantively shifted by $\Delta_1$ along the optical axis direction. Here, there is a relation:

$$\Delta_1 = (n-1)d/n$$

If the object point D displaces by $\Delta_1$ in the optical axis direction, the image point also displaces by $\Delta_2$ in the same direction. Here, if the projection magnification of the projection lens 21 is denoted by m, then there is a relation:

$$\Delta_2 = m^2 \Delta_1$$

As a specific numerical example wherein a dielectric material member having a refractive index n=1.5 is used in a reduction imaging optical system having a reduction ratio of 1:4, in order to provide a displacement $\Delta_2 = 1$ micron, in calculation, the displacement $\Delta_1$ should be equal to 16 microns and, to assure this, the thickness d should be equal to 48 microns.

For simplicity, an explanation will now be given of the imaging process of one point P upon the reticle 1 in FIG. 7.

Figure 10A:
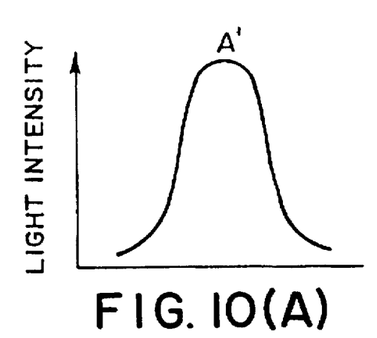
FIGS. 10(A) and 10(B) are schematic views for explaining a light intensity distribution on an image plane in the projection exposure apparatus of FIG. 7.

Point P' on the wafer W is the point at which the image of the point P on the reticle 1 is to be imaged. Here, it is assumed that the Z-axis coordinate of the point P' has been adjusted by the stage 4 so that it is positioned at the middle between the points $I_A$ and $I_B$. As the reticle 1 is scanningly moved in the direction of arrow 1 $a$ and at the moment at which the point P comes to the position A, the stage 4 has been scanningly moved in the direction of arrow 3$a$ such that the point P' comes to the position A'. In this state, the point P' does not coincide with the point $I_A$ and, therefore, an optical image being somewhat deteriorated such as illustrated in FIG. 10(A) is transferred thereto.

Figure 10B:
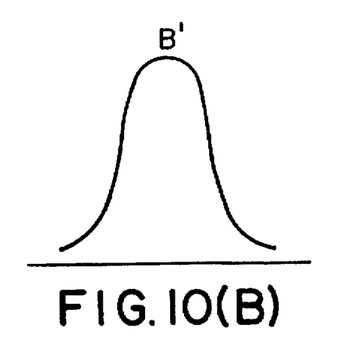

As the reticle 1 further moves and at the moment at which the point P comes to the position B, the point P' reaches the position B'. Since also at that moment the point P' does not coincide with the position $I_B$, an optical image being somewhat deteriorated such as illustrated in FIG. 10, as that of FIG. 10(A), is transferred thereto. Although the image transfer process has been explained with regard to two representative points A and B, if the point P is within a range $0 \leq X' \leq a/2$, the image transferred to the point P' has a distribution similar to that of FIG. 10(A). If the point P is within a range $a/2 \leq X' \leq a$, the image transferred to the point P' has a shape similar to that of FIG. 10(B). The image to be transferred to the point P' in the period in which the point P is scanningly displaced through the range of the slit 6, can be depicted as the sum of those of FIGS. 10(A) and 10(B), namely, such as illustrated in FIG. 11.

Here, a case where the point P' at which an image is to be formed shifts upwardly or downwardly due to surface unevenness of the wafer or a control error of the stage 3, for example, will be considered.

Figure 11:
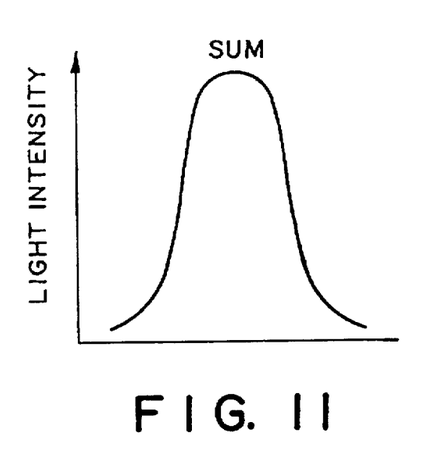
FIG. 11 is a schematic view for explaining a light intensity distribution of a pattern image as produced in accordance with the present invention.
Figure 12A:
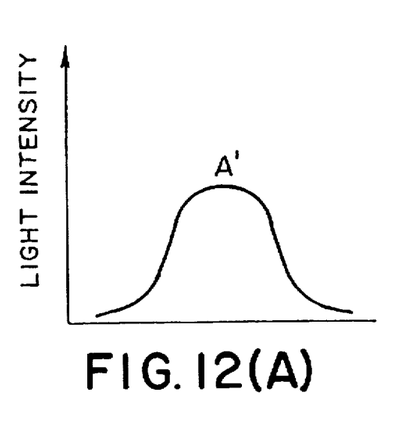
Figure 12B:
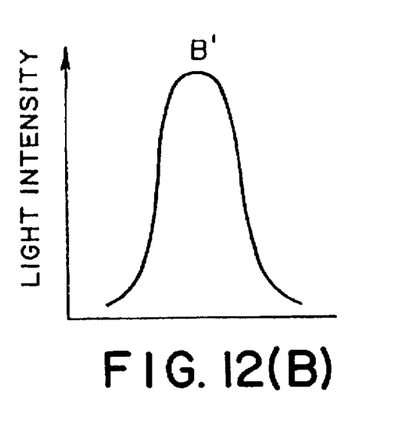
FIGS. 13(A) and 12(B) are schematic views for explaining another example of a light intensity distribution upon the image plane in the projection exposure apparatus of FIG. 7.

If the point P' shifts downwardly, the image at the point A' causes large deterioration such as illustrated in FIG. 12(A). However, at the point B', since it becomes close to the imaging point (ideal imaging point) $I_B$, the image formed there is very sharp such as illustrated in FIG. 12(B). The shape of the image transferred to the point P' in the period in which the P is scanningly moved through the range of the slit opening 5 corresponds to the sum of those of FIGS. 12(A) and 12(B), and it can be such as illustrated in FIG. 11.

Figure 13A:
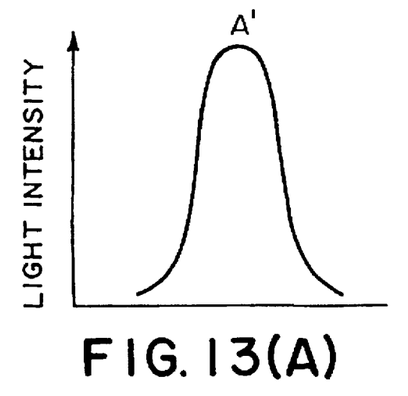
Figure 13B:
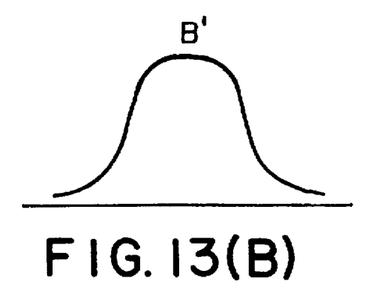

If the point P' shifts upwardly, the image transferred to the point A' and the image transferred to the point B' may be those as illustrated in FIGS. 13(A) and 13(B), being in inverse relation with FIGS. 12(A) and 12(B), but the finally formed image of the point P will be similarly to that illustrated in FIG. 11. Namely, even in cases where in the point P' shifts upwardly and downwardly (along the optical axis direction) in a certain range, similar images are obtainable constantly. This means that the depth of focus is substantively enlarged.

The dielectric material member 9 used as an optical member in this embodiment may have any shape provided that it is effective to displace the position of the object point along the optical axis direction by a predetermined amount, that is, to shift the imaging point position along the optical axis direction by a predetermined amount.

Figure 14:
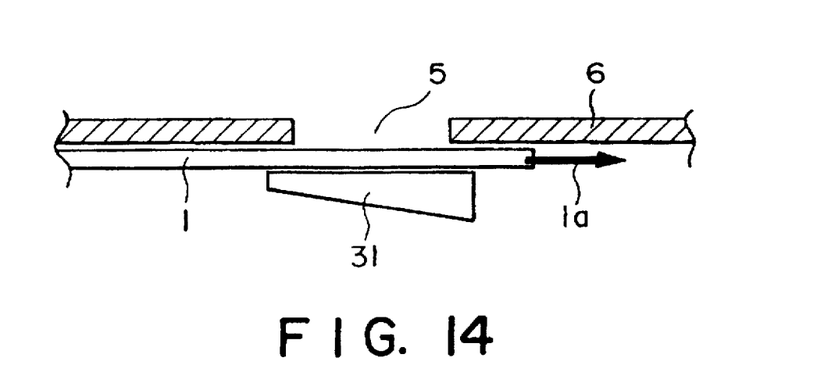
FIG. 14 is a schematic view of a portion of a projection exposure apparatus according to another embodiment of the present invention.
Figure 15:
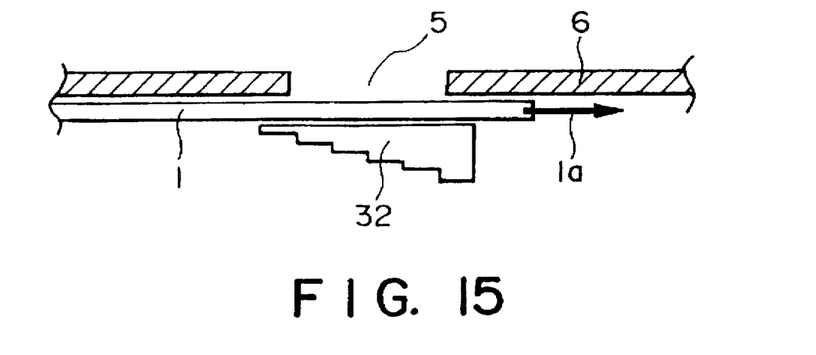
FIG. 15 is a schematic view of a portion of a projection exposure apparatus according to a further embodiment of the present invention.

FIGS. 14 and 15 are schematic views, respectively, each showing another example of dielectric member 31 (32) usable in the present invention and each explaining the positional relationship between the dielectric material member 31 (32) and the slit opening 5 of the aperture member 6.

The dielectric material member 31 of FIG. 14 has a shape with a thickness which uninterruptedly changes along the scan direction 1$a$ of the reticle 1, within the range of the slit opening 5. The thickness distribution of the dielectric material member 31 along the Y-axis direction perpendicular to the scan direction is even. Thus, the dielectric material member 31 has a wedge-like shape. This is effective to uninterruptedly change the imaging position in the image space of the projection lens 2, along the optical axis direction, such that, owing to the effect of multiple exposure similar to that having been described, substantive enlargement of the depth of focus is assured.

The dielectric material member 32 of FIG. 15 has a shape (step-like shape) with a thickness which changes stepwise along the scan direction 1$a$ of the reticle 1, within the range of the slit opening 5. This assures similar advantageous effects as have been described with reference to the multiple exposure method. The dielectric material member has an even thickness distribution along the Y-axis direction perpendicular to the scan direction 1$a$.

In theses embodiments of the present invention, a scanning multiple exposure process uses a difference in thickness of a dielectric material member as described above. However, similar results may be obtained with the use of a dielectric member having a refractivity distribution (changing refractive index) along the scan direction of the reticle.

With regard to a direction perpendicular to the scan direction of the reticle, it is not always necessary that a dielectric material member has an even thickness or an even refractive index.

In place of using a slit opening, a cylindrical lens, for example, may be used to provide slit-like illumination light.

Next, an embodiment of a device manufacturing method which uses a projection exposure apparatus such as described above, will be explained.

Figure 16:
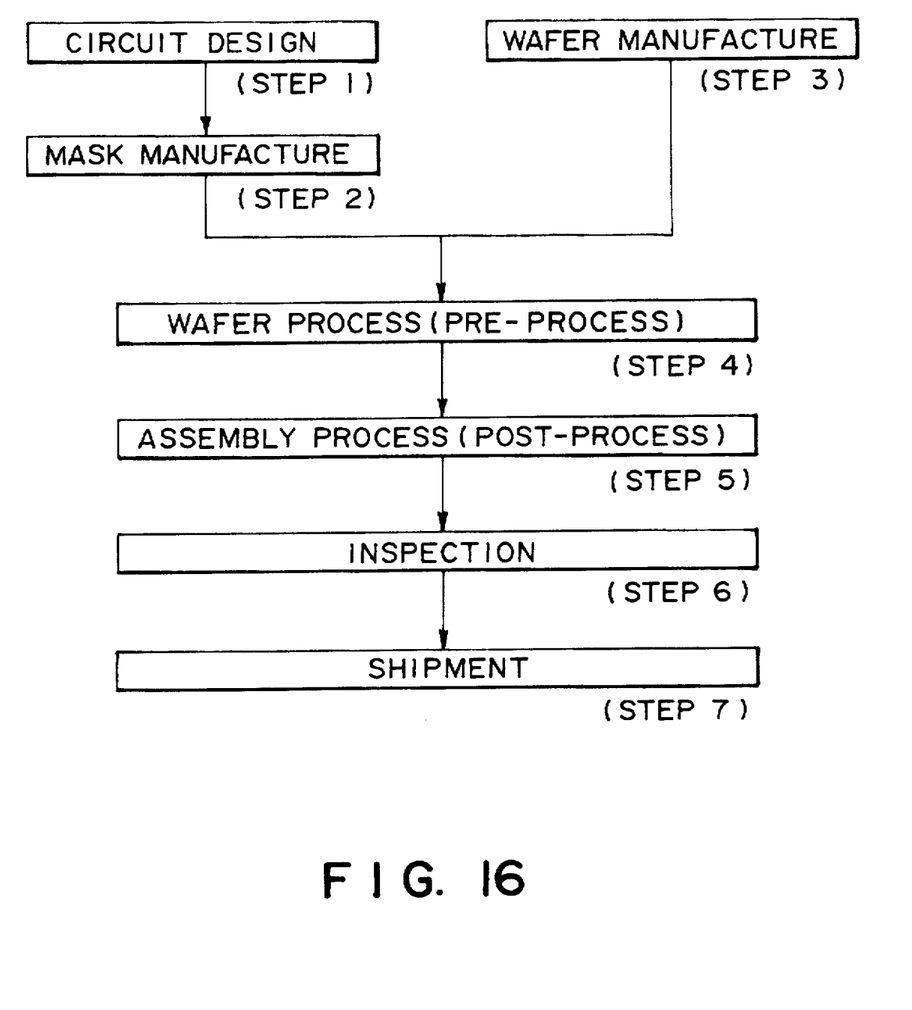
FIG. 16 is a flow chart of device manufacturing processes according to an embodiment of the present invention.

FIG. 16 is a flow chart of the sequence of manufacturing a microdevice such as a semiconductor chip (e.g., an IC or an LSI), a liquid crystal panel or a CCD, for example. Step 1 is a design process for designing the circuit of a semiconductor device, for example. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 17:
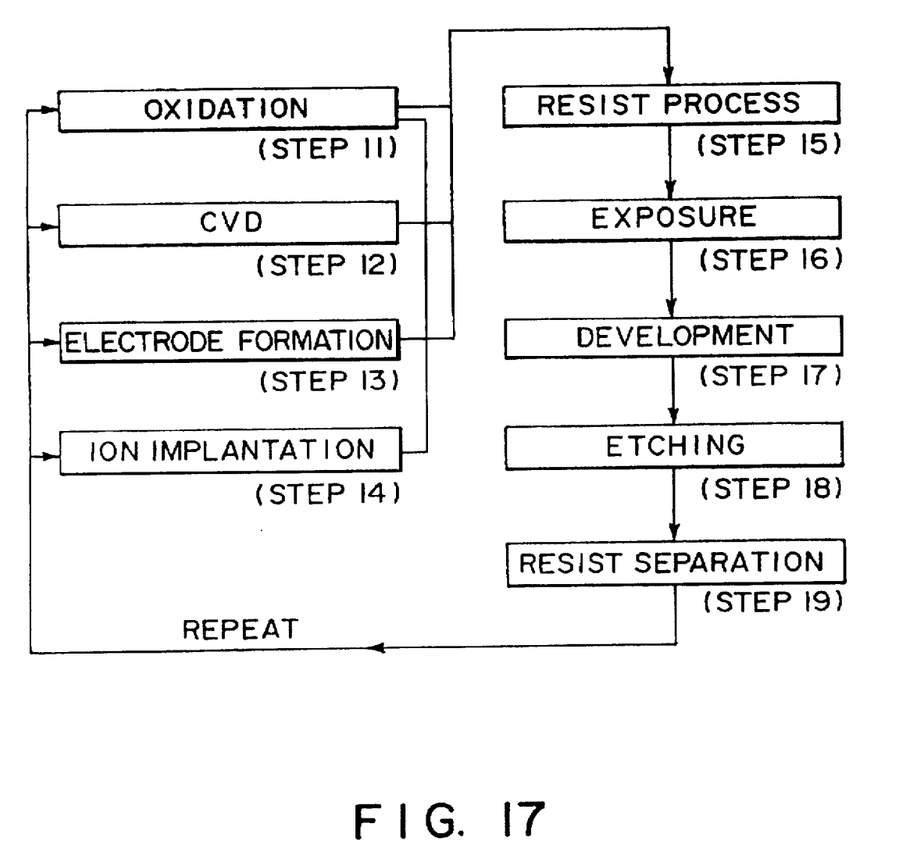
FIG. 17 is a flow chart for explaining details of a process included in the processes of FIG. 16.

FIG. 17 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning projection exposure apparatus, comprising:

imaging means for illuminating an original with illumination light and for projecting a pattern of the illuminated original onto a substrate through a projection optical system; and scanning means for relatively scanning the original and the substrate relative to said imaging means, in a direction perpendicular to an optical axis of said protection optical system, wherein the illumination light defines an illumination region upon the original, the pattern of the original being scanned moves through different locations within the illumination region, and said imaging means is arranged so that, for projection of the pattern of the original at the different locations within the illumination region, the pattern is imaged at different imaging positions, being different with respect to the direction of the optical axis of said projection optical system.

2. An apparatus according to claim 1, wherein said imaging means comprises an optical member for defining different optical path lengths for imaging light in relation to the different locations within the illumination region.

3. An apparatus according to claim 2, wherein said optical member is disposed between an object plane of the original and the projection optical system.

4. An apparatus according to claim 2, wherein said imaging means provides different imaging positions with respect to a direction of an optical axis, to two zones on an object plane of the original, which zones are juxtaposedly defined along the scanning direction, and said optical member comprises a rectangular solid member made of a dielectric material, said rectangular solid member being disposed in one of the paths for the imaging lights from the two zones, so as to define an optical path difference between these paths.

5. An apparatus according to claim 4, wherein said optical member is disposed between an object plane of the original and the projection optical system.

6. An apparatus according to claim 2, wherein said optical member comprises a wedge-shaped member made of a dielectric material and has a thickness changing along the scanning direction, and wherein said wedge-shaped member is disposed across the paths for the imaging light so as to define optical path differences to the paths.

7. An apparatus according to claim 6, wherein said wedge-shaped member is disposed between an object plane of the original and the projection optical system.

8. An apparatus according to claim 2, wherein said optical member comprises a step-shaped member made of a dielectric material and has a thickness changing along the scanning direction, and wherein said step-shaped member is disposed across the paths for the imaging light so as to define optical path differences to the paths.

9. An apparatus according to claim 8, wherein said step-shaped member is disposed between an object plane of the original and the projection optical system.

10. An apparatus according to claim 2, wherein said optical member comprises a distributed refractivity member made of a dielectric material and has a thickness changing along the scanning direction, and wherein said distributed refractivity member is disposed across the paths for the imaging light so as to define optical path differences to the paths.

11. An apparatus according to claim 10, wherein said distributed refractivity member is disposed between an object plane of the original and the projection optical system.

12. A device manufacturing method which comprises a step of printing a device pattern on a substrate by use of a scanning projection exposure apparatus as recited in any one of claims 1–11.

* * * * *

UNITED STATES PATENT AND TRADEMARK OFFICE
CERTIFICATE OF CORRECTION

| | | |
|---|---|---|
| PATENT NO. : | 5,706,077 | Page 1 of 2 |
| DATED : | January 6, 1998 | |
| INVENTOR(S) : | YASUYUKI UNNO | |

It is certified that error appears in the above-identified patent and that said Letters Patent is hereby corrected as shown below:

COLUMN 2:

Line 58, "of not a large" should read --of not significant--.

COLUMN 5:

Line 34, "stage. (not shown)," should read --stage (not shown),--.

COLUMN 6:

Line 27, "he" should read --the--; and
Line 39, "(FIG. 9(B)" should read --(FIG. 9(B))--.

COLUMN 7:

Line 6, "1 a" should read --1a--;
Line 46, "similarly" should read --similar--;
Line 47, "where in" should read --wherein--;

UNITED STATES PATENT AND TRADEMARK OFFICE
CERTIFICATE OF CORRECTION

PATENT NO. : 5,706,077
DATED : January 6, 1998
INVENTOR(S) : YASUYUKI UNNO

It is certified that error appears in the above-identified patent and that said Letters Patent is hereby corrected as shown below:

COLUMN 7

Line 49, "are" should read --are constantly--; and
Line 50, "able constantly." should read --able.--.

Signed and Sealed this

Thirtieth Day of June, 1998

Attest:

BRUCE LEHMAN

Attesting Officer

Commissioner of Patents and Trademarks